United States Patent
Cho et al.

(10) Patent No.: US 11,811,380 B2
(45) Date of Patent: Nov. 7, 2023

(54) MICRO-RESONATOR DESIGN IMPLEMENTING INTERNAL RESONANCE FOR MEMS APPLICATIONS

(71) Applicant: Ohio State Innovation Foundation, Columbus, OH (US)

(72) Inventors: Han Na Cho, Dublin, OH (US); Jun Yu, Columbus, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 110 days.

(21) Appl. No.: 17/439,149

(22) PCT Filed: Mar. 13, 2020

(86) PCT No.: PCT/US2020/022674
§ 371 (c)(1),
(2) Date: Sep. 14, 2021

(87) PCT Pub. No.: WO2020/186180
PCT Pub. Date: Sep. 17, 2020

(65) Prior Publication Data
US 2022/0158602 A1     May 19, 2022

Related U.S. Application Data

(60) Provisional application No. 62/818,234, filed on Mar. 14, 2019.

(51) Int. Cl.
    *H03H 3/007*        (2006.01)
    *H03H 9/02*         (2006.01)
    *H03H 9/24*         (2006.01)

(52) U.S. Cl.
    CPC ...... *H03H 3/0077* (2013.01); *H03H 9/02409* (2013.01); *H03H 9/2463* (2013.01)

(58) Field of Classification Search
    CPC ............. H03H 3/0077; H03H 9/02409; H03H 9/2463; H03H 9/02259; H03H 2009/02488
See application file for complete search history.

(56) References Cited

U.S. PATENT DOCUMENTS

| | | | |
|---|---|---|---|
| 7,726,189 B2* | 6/2010 | Vyas | H03H 9/505 333/186 |
| 8,836,444 B2 | 9/2014 | Lopez et al. | |
| 9,680,414 B1* | 6/2017 | Chen | H03L 5/00 |

OTHER PUBLICATIONS

A. Z. Hajjaj, N. Jaber, S. Ilyas, F. K. Alfosail, and M. I. Younis, "Linear and nonlinear dynamics of micro and nano-resonators: Review of recent advances," Int. J. Non-Linear Mech., Oct. 2019, 58 pages.

(Continued)

*Primary Examiner* — Jeffrey M Shin
(74) *Attorney, Agent, or Firm* — Meunier Carlin & Curfman LLC

(57) ABSTRACT

Frequency stabilization is provided in a microelectromechanical systems (MEMS) oscillator via tunable internal resonance (IR). A device comprises a MEMS resonator comprising a stepped-beam structure that is a thin-layer structure. The resonator may be configured to implement IR. The stepped-beam structure may be configured to provide flexibility to adjust modal frequencies into a n:m ratio, wherein n and m are integers. The thin-layer structure provides frequency tunability by controlling the mid-plane stretching effect with an applied DC bias. The thin-layer structure compensates for a frequency mismatch from a n:m ratio due to a fabrication error. The MEMS resonator may be an oscillator.

18 Claims, 8 Drawing Sheets

(56) References Cited

OTHER PUBLICATIONS

C. T. Nguyen, "MEMS technology for timing and frequency control," IEEE Trans. Ultrason. Ferroelectr. Freq. Control, vol. 54, No. 2, pp. 251-270, Feb. 2007.

Vig, John R., and Yoonkee Kim. "Noise in microelectromechanical system resonators." IEEE transactions on ultrasonics, ferroelectrics, and frequency control 46.6 (1999): 1558-1565.

J. M. Miller, N.E. Bousse, D.B. Heinz, H.J.K. Kim, H.K. Kwon, G.D. Vukasin, and T.W. Kenny, "Thermomechanical-Noise-Limited Capacitive Transduction of Encapsulated MEM Resonators," J. Microelectromechanical Syst., pp. 965-976, 2019.

M. Sansa, E. Sage, E.C. Bullard, M.Gely, T.Alava, E. Colinet, A.k. Naik, L.G. Villanueva, L. Duraffourg, M.L. Roukes and G. Jourdan "Frequency fluctuations in silicon nanoresonators," Nat. Nanotechnol., vol. 11, No. 6, pp. 552-558, Jun. 2016.

Eichler; Bachtold. "Strong coupling between mechanical modes in a nanotube resonator." Physical review letters 109, No. 2 (2012): 025503.

K. Asadi, J. Yu, and H. Cho, "Nonlinear couplings and energy transfers in micro-and nano-mechanical resonators: intermodal coupling, internal resonance and synchronization," Philos. Trans. R. Soc. Math. Phys. Eng. Sci., vol. 376, No. 2127, p. 20170141, Aug. 2018.

Lee & Yu, "Frequency Stabilization in a MEMS Oscillator with 1:2 Internal Resonance," in 2019 IEEE International Symposium on Inertial Sensors and Systems (Inertial), 2019, pp. 1-4.

D. Antonio, D. H. Zanette, and D. López, "Frequency stabilization in nonlinear micromechanical oscillators," Nat. Commun., vol. 3, No. 1, pp. 1-6, May 2012.

J. R. Clark, W.-T. Hsu, M. A. Abdelmoneum, and C. T.-C. Nguyen, "High-Q UHF micromechanical radial-contour mode disk resonators," J. Microelectromechanical Syst., vol. 14, No. 6, pp. 1298-1310, Dec. 2005.

Postma, H. W. Ch., Kozinsky, I., Husain, A. & Roukes, M. L. Dynamic range of nanotube- and nanowire-based electromechanical systems. Appl. Phys. Lett. 86, 223105 (2005).

Asadi, K., Li, J., Peshin, S., Yeom, J. & Cho, H. Mechanism of geometric nonlinearity in a nonprismatic and heterogeneous microbeam resonator. Phys. Rev. B 96, (2017).

Hajjaj, A. Z., Hafiz, M. A. & Younis, M. I. Mode Coupling and Nonlinear Resonances of MEMS Arch Resonators for Bandpass Filters. Sci. Rep. 7, 41820 (2017).

Hajjaj, A. Z., Jaber, N., Hafiz, M. A. A., Ilyas, S. & Younis, M. I. Multiple internal resonances in MEMS arch resonators. Phys. Lett. A 382, 3393-3398 (2018).

Cho, H. et al. Nonlinear hardening and softening resonances in micromechanical cantilever-nanotube systems originated from nanoscale geometric nonlinearities. Int. J. Solids Struct. 49, 2059-2065 (2012).

Jaber, N., Ramini, A. & Younis, M. I. Multifrequency excitation of a clamped-clamped microbeam: Analytical and experimental investigation. Microsyst. Nanoeng. 2, 16002 (2016).

Ekinci, K. L., Yang, Y. T. & Roukes, M. L. Ultimate limits to inertial mass sensing based upon nanoelectromechanical systems. J. Appl. Phys. 95, 2682-2689 (2004).

Pang, W. et al. Femtogram mass sensing platform based on lateral extensional mode piezoelectric resonator. Appl. Phys. Lett. 88, 243503 (2006).

Bouchaala, A., Nayfeh, A. H., Jaber, N. & Younis, M. I. Mass and position determination in MEMS mass sensors: a theoretical and an experimental investigation. J. Micromechanics Microengineering 26, 105009 (2016).

Ilic, B. et al. Enumeration of DNA Molecules Bound to a Nanomechanical Oscillator. Nano Lett. 5, 925-929 (2005).

Pang, W. et al. Piezoelectric microelectromechanical resonant sensors for chemical and biological detection. Lab. Chip 12, 29-44 (2012).

Su, T. et al. Silicon MEMS Disk Resonator Gyroscope With an Integrated CMOS Analog Front-End. IEEE Sens. J. 14, 3426-3432 (2014).

Nitzan, S. et al. Epitaxially-encapsulated polysilicon disk resonator gyroscope. in 2013 IEEE 26th International Conference on Micro Electro Mechanical Systems (MEMS) 625-628 (2013). doi:10.1109/MEMSYS.2013.6474319.

Xu, Y. et al. Radio frequency electrical transduction of graphene mechanical resonators. Appl. Phys. Lett. 97, 243111 (2010).

Basu, J. & Bhattacharyya, T. K. Microelectromechanical resonators for radio frequency communication applications. Microsyst. Technol. 17, 1557 (2011).

Nguyen, C. T.-. Mems technology for timing and frequency control. IEEE Trans. Ultrason. Ferroelectr. Freq. Control 54, 251-270 (2007).

Yao, A. & Hikihara, T. Logic-memory device of a mechanical resonator. Appl. Phys. Lett. 105, 123104 (2014).

Hafiz, M. a. A., Kosuru, L. & Younis, M. I. Microelectromechanical reprogrammable logic device. Nat. Commun. 7, 11137 (2016).

Boales, J. A., Mateen, F. & Mohanty, P. Optical wireless information transfer with nonlinear micromechanical resonators. Microsyst. Nanoeng. 3, 17026 (2017).

Mateen, F., Boales, J., Erramilli, S. & Mohanty, P. Micromechanical resonator with dielectric nonlinearity. Microsyst. Nanoeng. 4, 14 (2018).

Shoshani, O., Shaw, S. W. & Dykman, M. I. Anomalous dissipation of nanomechanical modes going through nonlinear resonance. (2017).

Vyas, A., Peroulis, D. & Bajaj, A. K. Dynamics of a nonlinear microresonator based on resonantly interacting flexural-torsional modes. Nonlinear Dyn. 54, 31-52 (2008).

Vyas, A., Peroulis, D. & Bajaj, A. K. A Microresonator Design Based on Nonlinear 1:2 Internal Resonance in Flexural Structural Modes. J Microelectromech Syst 18, 744-762 (2009).

Tripathi, A. & Bajaj, A. K. Topology optimization and internal resonances in transverse vibrations of hyperelastic plates. Int J Solids Struct 81, 311-328 (2016).

Tripathi, A. & Bajaj, A. K. Design for 1:2 Internal Resonances in In-Plane Vibrations of Plates With Hyperelastic Materials. J. Vib. Acoust. 136, 061005-061005-10 (2014).

Younis, M. I. & Nayfeh, A. H. A Study of the Nonlinear Response of a Resonant Microbeam to an Electric Actuation. Nonlinear Dyn 31, 91-117 (2003).

Mangussi, F. & Zanette, D. H. Internal Resonance in a Vibrating Beam: A Zoo of Nonlinear Resonance Peaks. PLOS One 11, e0162365 (2016).

Li, L., Zhang, Q., Wang, W. & Han, J. Nonlinear coupled vibration of electrostatically actuated clamped-clamped microbeams under higher-order modes excitation. Nonlinear Dyn. 90, 1593-1606 (2017).

Dou, S., Strachan, B. S., Shaw, S. W. & Jensen, J. S. Structural optimization for nonlinear dynamic response. Philos. Trans. R. Soc. Math. Phys. Eng. Sci. 373, 20140408 (2015).

Sarrafan, A., Bahreyni, B. & Golnaraghi, F. Development and Characterization of an H-Shaped Microresonator Exhibiting 2:1 Internal Resonance. J Microelectromech Syst 26, 993-1001 (2017).

Zhang, T., Guo, C., Jiang, Z. & Wei, X. Internal resonance between the extensional and flexural modes in micromechanical resonators. J. Appl. Phys. 126, 164506 (2019).

International Preliminary Report on Patentability issued for Application No. PCT/US2020/022674, dated Sep. 23, 2021.

International Search Report and Written Opinion, issued by the International Searching Authority (ISA/US) in PCT Application No. PCT/US2020/022674 dated Jul. 22, 2020. 10 pages.

Asadi, Keivan, et al. "Mechanism of geometric nonlinearity in a nonprismatic and heterogeneous microbeam resonator." Physical Review B 96.11 (2017): 115306. 9 pages.

Yu, Jun, et al. "Frequency Stabilization in a MEMS Oscillator with 1: 2 Internal Resonance. " 2019 IEEE International Symposium on Inertial Sensors and Systems (Inertial). IEEE, Apr. 1, 2019. 4 pages.

* cited by examiner

MICRO-RESONATOR DESIGN IMPLEMENTING INTERNAL RESONANCE FOR MEMS APPLICATIONS

CROSS-REFERENCE TO RELATED APPLICATIONS

This application is a national stage application filed under 35 U.S.C. § 371 of PCT/US2020/022674 filed Mar. 13, 2020, which claims the benefit of U.S. provisional patent application No. 62/818,234, filed on Mar. 14, 2019, and entitled "MICRO-RESONATOR DESIGN IMPLEMENTING INTERNAL RESONANCE FOR MEMS APPLICATIONS," the disclosure of which is expressly incorporated herein by reference in its entirety.

STATEMENT OF GOVERNMENT SUPPORT

This invention was made with government support under D16AP00110 awarded by the DARPA (Defense Advanced Research Projects Agency). The government has certain rights in the invention.

BACKGROUND

Microelectromechanical systems (MEMS) attract great interest due to their compact dimensions, fast response, high sensitivity, and low power consumption, and are widely used in many industrial, commercial, and scientific applications. Micromechanical resonators are one category of MEMS that are designed to operate at or near their resonant frequencies. These resonators are often fabricated into beam or disk structures. The ultralow damping combined with low effective mass allows them to operate at very high resonant frequencies with high Q-factors. In addition, they have diverse actuation/detection mechanisms. These attributes exploit micromechanical resonators into a key element in micromechanical oscillators and sensors for providing reference frequencies and high sensitivity.

One of the most important attributes of resonators is the frequency stability, which determines their performance of sensitivity and reliability. However, when their dimensions shrink to micro- and even nano-scale, the frequency can fluctuate due to various noise sources even with tiny energy such as thermal noise, absorbing/desorbing molecules, and additive noises from actuation and transduction circuits. In other words, instabilities that are negligible in macro-scale devices become dominated when the dimensions of the oscillators shrink down to the micro- and nano-scale. Temperature fluctuations, moisture change, adsorbing/desorbing molecules, even fluctuations in the number of photons can all affect the frequency stability. Additionally, micromechanical oscillators often fall in the nonlinear regime when it is strongly driven to acquire the large signal-to-noise ratio. An undesired consequence of nonlinear operation is that extensive frequency fluctuations are induced to the oscillator which further degrades their performances. As timing devices, the key role of oscillator is to provide stable reference frequencies, but all of these instabilities prevent the advances of micromechanical oscillators.

Various strategies for frequency stabilization have been proposed in previous studies, such as achieve ultra-high Q factor and synchronization of oscillators. However, no published frequency stability measurements attain the limit set by the thermo-mechanical noise, and are still several orders higher than the thermo-mechanical noise limit.

It is known that the mechanism of internal resonance (IR) improves the frequency stability in MEMS oscillators and MEMS sensors. IR, however, is not easy to realize in a prismatic structure, because it can be only triggered when a commensurate condition between two (or more) involved modes is satisfied. It is with respect to these and other considerations that the various aspects and embodiments of the present disclosure are presented.

SUMMARY

Certain aspects of the present disclosure relate to frequency stabilization in a microelectromechanical systems (MEMS) oscillator via tunable internal resonance (IR). Some non-limiting examples of embodiments of the present disclosure include the following.

An implementation comprises a MEMS non-prismatic resonator, with a stepped-beam structure that is a thin-layer structure. The resonator may be configured to implement IR. The stepped-beam structure may be configured to provide flexibility to adjust modal frequencies into a n:m ratio, wherein m and n are integers, and m and n can be the same integer or can be different integers from each other depending on the implementation. The thin-layer structure provides frequency tunability by controlling the mid-plane stretching effect with an applied DC bias. The thin-layer structure compensates for a frequency mismatch from a n:m ratio due to a fabrication error. The MEMS resonator may be an oscillator.

According to some aspects, a mistuning between two flexural modes of the MEMS resonator can be precisely controlled by tuning a DC bias and, through strong coupling between the two flexural modes, a broader range of frequency stabilization is achieved by IR.

In some implementations, the device may comprise a stepped clamped-clamped silicon microbeam. The stepped clamped-clamped silicon microbeam may be fabricated by a MEMS fabrication flow to implement an IR mechanism.

In some aspects, the present invention relates to systems and techniques for a thin-layer stepped-beam MEMS resonator that can readily implement TR. A thin-layer stepped-beam structure allows for the attainment of the commensurate condition between two vibrational modes. Moreover, high frequency tunability achieved by its thin structure enables tuning the IR to its optimal condition by adjusting an applied DC voltage.

This summary is provided to introduce a selection of concepts in a simplified form that are further described below in the detailed description. This summary is not intended to identify key features or essential features of the claimed subject matter, nor is it intended to be used to limit the scope of the claimed subject matter.

BRIEF DESCRIPTION OF THE DRAWINGS

The foregoing summary, as well as the following detailed description of illustrative embodiments, is better understood when read in conjunction with the appended drawings. For the purpose of illustrating the embodiments, there is shown in the drawings example constructions of the embodiments; however, the embodiments are not limited to the specific methods and instrumentalities disclosed. In the drawings.

DETAILED DESCRIPTION

Figure 1:
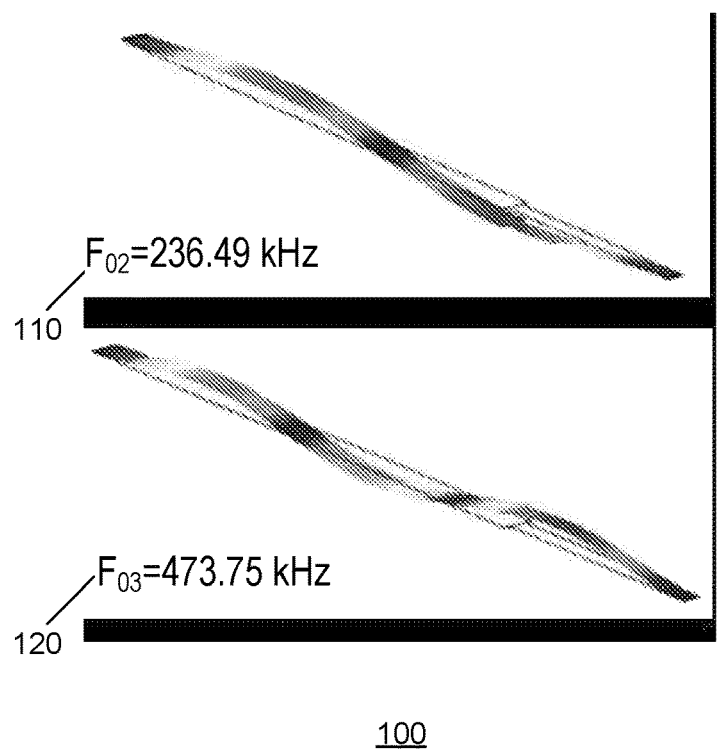
FIG. 1 is an illustration of a modal analysis used to predict dimensions of resonators which can satisfy commensurability between second and third modes.

This description provides examples not intended to limit the scope of the appended claims. The figures generally indicate the features of the examples, where it is understood and appreciated that like reference numerals are used to refer to like elements. Reference in the specification to "one embodiment" or "an embodiment" or "an example embodiment" means that a particular feature, structure, or characteristic described is included in at least one embodiment described herein and does not imply that the feature, structure, or characteristic is present in all embodiments described herein.

A non-prismatic (e.g., with varying dimension) micromechanical resonator or nanomechanical resonator that can readily implement internal resonance (IR) is described. The non-prismatic resonator may be a stepped-beam resonator in some implementations. IR can happen in a nonlinear system, when frequencies of two or more resonant modes are commensurable or nearly commensurable (e.g., n:m ratio, wherein m and n are integers, and m and n can be the same integer or can be different integers from each other depending on the implementation). When the IR happens, the engaged modes in the commensurable condition can effectively exchange energy internally. Such an "internal" energy transfer happens much faster than the "external" energy transfer happening between the structure and the environment (e.g., energy dissipation from the system to the environment, energy pumping from the driving force to the system).

Frequency stability is a key parameter to determine the performance of a microelectromechanical (MEM) resonator. When a MEM resonator is driven by a single-frequency actuation and conditions for IR are satisfied, two engaged modes are simultaneously resonated with their phases locked together through a strong and effective intermodal energy transfer. The increased inertia of these two active resonant modes leads to the frequency stabilization in both frequency outputs. In an open-loop experimental setting, the IR achieved a six-fold improvement in the frequency stability.

There are many advantages from using the mechanism of IR, as implemented in the resonator designs provided herein. For example, (1) frequency stabilization in MEMS oscillators and nanoelectromechanical systems (NEMS) oscillators, (2) strategies to control energy transfer in micro-resonators and nano-resonators, (3) multiple modes for multi-modal sensing capability, and (4) frequency control in radio-frequency (RF) MEMS.

Described herein is a (i) non-prismatic, (ii) clamped-clamped, and/or (iii) thin layer of beam (or other 2D structural) design as a platform that can readily implement IR. IR is not easy to realize in a prismatic (constant dimension) structure because a clamped-clamped prismatic structure typically does not provide a n:m ratio. A stepped-beam structure provides ample flexibility to adjust modal frequencies into a n:m ratio, wherein m and n are integers during the design process. Internal coupling can be significantly enhanced when the system has an asymmetric resonant mode shape. Coupling the second and third modes is more effective than coupling other modes. The clamped-clamped structure inherently provides a nonlinear coupling between mode via mid-plane stretching. The mode frequency of a thin structure is easy to tune by using various mechanisms (e.g., tuning mid-plane stretching electrostatically by applying DC bias).

As described further herein, 1:2 IR is implemented on the second and third flexural modes. Through this strong coupling, a broad IR range is achieved and frequency stability is improved close to its thermo-mechanical noise limit because IR stabilizes frequency from the mechanical domain.

FIG. 1 is an illustration of a modal analysis 100 used to predict dimensions of resonators which can satisfy commensurability between second and third modes. The second and third mode frequencies 110, 120 are 236.49 kHz and 473.75 kHz, respectively. In other words, as shown in FIG. 1, the modal analysis prediction of second and third flexural modes are 236.49 kHz and 473.75 kHz, respectively, which satisfies a 1:2 commensurate condition. Thin-layer structures are more sensitive to mid-plane stretching which is determined by DC bias, and thus have high tunability to compensate the fabrication variance. A clamped-clamped beam structure may also be used, and has higher resonant frequencies comparing with other structures with similar dimensions.

Figure 2:
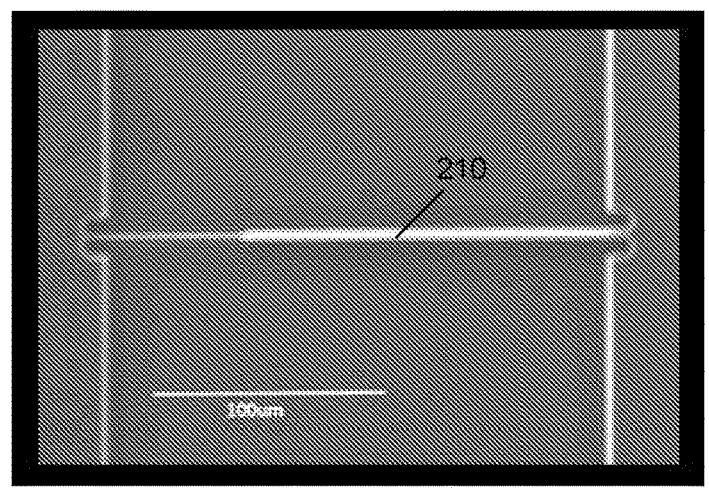
FIG. 2 is a scanning electron microscopy (SEM) image of an implementation of a batch-fabricated thin-layer stepped-beam resonator.

FIG. 2 is a scanning electron microscopy (SEM) image 200 of an implementation of a batch-fabricated thin-layer stepped-beam resonator 210. The resonator 210 may be fabricated by conventional microfabrication process. The scale bar is 100 μm. A thin-layer stepped-beam micromechanical resonator 210 is provided to couple their second and third flexural modes by 1:2 IR. Prismatic structures have their own eigenvalue ratio between mode frequencies, which are not often commensurate. To this end, the designed structure comprises a wider part of $L_1=187$ μm, $W_1=8.9$ μm and a narrow part of $L_2=68$ μm, $W_2=4$ μm with a uniform thickness T of 500 nm.

A MEMS resonator, such as the resonator 210, may be fabricated by conventional flow. Briefly, a microbeam was patterned in a silicon-on-insulator (SOI) wafer with 500 nm device layer and 2 μm box layer using photolithography technique. Then, reactive ion etching (RIE) is employed to etch exposed area and then the wafer is immersed in hydrofluoric acid solution to release the beam. The device is mounted in a vacuum chamber, with pressure around 3 mTorr. An AC signal produced by an internal function generator of a lock-in amplifier (Zurich Instrument HF2LI) may be applied to drive the microbeam. The involved vibrational amplitudes may be detected optically by a laser Doppler Vibrometer (LDV, Polytec OFV-534 sensor & OFV-5000 controller), since they are out-of-plane flexural modes. The LDV output a voltage signal which is proportional to displacement of microbeam. This resulting signal is induced to the lock-in amplifier and a spectrum analyzer (Tektronix RSA603A) simultaneously, which not only measure higher or lower harmonics but also detect the full spectrum of IR.

Micromechanical resonators can implement the IR. By controlling the DC bias, the commensurate relationship between second and third flexural modes can be achieved, which is the prerequisite of IR. To experimentally characterize IR and study frequency stability, set up a RF/LO mixing measurement system to avoid influence from the parasitic feedthrough current and acquire unmasked motional signal. In this setting, verify that the IR happens in the stepped-beam resonator and its frequency stability improves by six-fold. The mechanism of IR stabilizes the frequency from the mechanical domain, which is the main source of frequency fluctuation.

Figure 3:
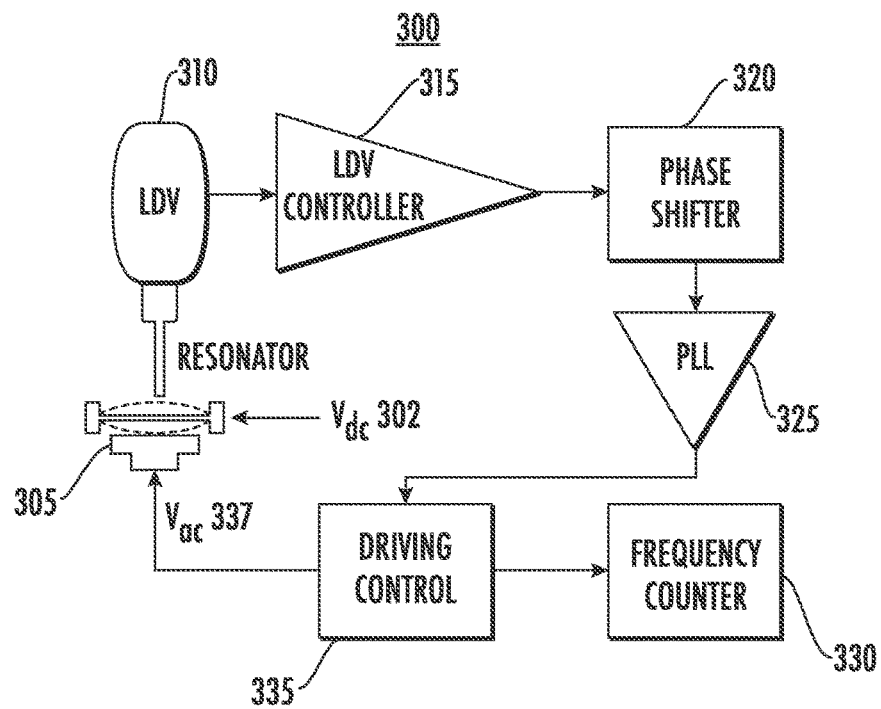
FIG. 3 is a diagram of a close-loop configuration system with electrostatic actuation and optical detection.

These batch-fabricated resonators were actuated electrostatically and detected optically by a closed-loop experimental configuration as shown in FIG. 3. FIG. 3 is a diagram of a close-loop configuration system 300 with electrostatic actuation and optical detection for a resonator 305. By changing the DC bias voltage ($V_{dc}$ 302), mode frequencies were electrostatically tuned to be commensurate to satisfy the required IR condition. Optical detection by LDV 310 (controlled by an LDV controller 315) measured tiny motions precisely and output a voltage proportional to the motional displacement. Another advantage of LDV measurement is that it avoids undesired electrical signal, such as parasitic feedthrough signal. A phase shifter 320, phase-locked loop (PLL) 325, and digital frequency counter 330 may be used to study the frequency stability. The output of the PLL 325 is provided to a driving control 335, which provides $V_{ac}$ 337 to the resonator, and also provides output to the frequency counter 330.

Regarding a closed-loop characterization, the instrumental connection of closed-loop configuration is the same as the open-loop configuration, but a built-in phase shifter 320, PLL 325, and digital frequency counter 330 of the lock-in amplifier are employed here. The output signal of the LDV 310 is phase shifted by the phase shifter 320 and then induced to the PLL 325. By using a PID controller, the PLL 325 keeps phase difference between input and output of a lock-in amplifier. The built-in signal generator is used to set the amplitude of output signal. Thus, the resulting signal with a constant amplitude and locked phase is produced by the lock-in amplifier and used to excite the MEMS resonator 305. The PLL 325 locks the oscillator at a desired point in the frequency-to-amplitude curve. Then, the frequency fluctuation of this resonator 305 can be detected by measuring the frequency of the oscillations with the digital frequency counter 330.

The environment of FIG. 3 is only one example of a suitable computing environment and is not intended to suggest any limitation as to the scope of use or functionality. The devices of FIG. 3 are well known in the art and need not be discussed at length here. Numerous other general purpose or special purpose computing devices environments or configurations may be used. Examples of well known computing devices, environments, and/or configurations that may be suitable for use include, but are not limited to, personal computers, server computers, handheld or laptop devices, multiprocessor systems, microprocessor-based systems, network personal computers (PCs), minicomputers, mainframe computers, embedded systems, distributed computing environments that include any of the above systems or devices, and the like.

Computer-executable instructions, such as program modules, being executed by a computer may be used. Generally, program modules include routines, programs, objects, components, data structures, etc. that perform particular tasks or implement particular abstract data types. Distributed computing environments may be used where tasks are performed by remote processing devices that are linked through a communications network or other data transmission medium. In a distributed computing environment, program modules and other data may be located in both local and remote computer storage media including memory storage devices.

Figure 4:
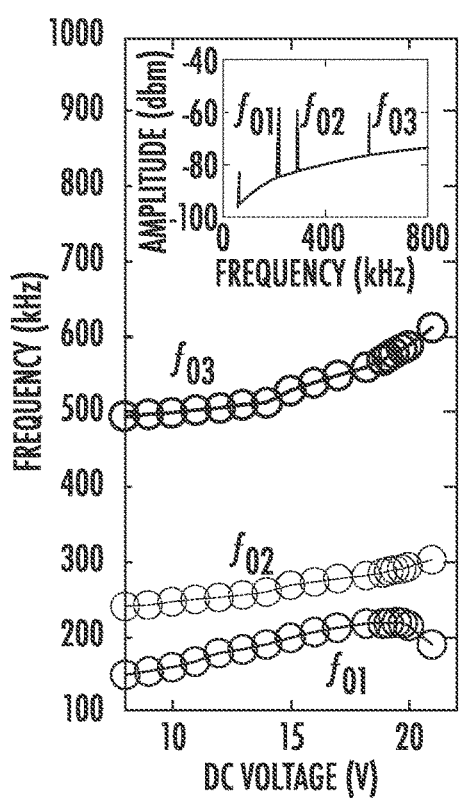
FIG. 4 shows mode frequencies of first three flexural modes under different DC bias voltages.

To experimentally realize the IR, first tune the system to satisfy the commensurate condition between second and third flexural modes. The measurements may be performed at room temperature and under vacuum (pressure less than 3 mTorr). FIG. 4 shows mode frequencies of first three flexural modes under different DC bias voltages. The mode frequencies were characterized from thermal-mechanical noise under different DC bias. The inset show the thermal-mechanical noise when DC bias voltage was 19.1V.

Thus, the first three flexural mode frequencies were obtained by measuring the thermo-mechanical responses, as shown in the inset of FIG. 4, while a DC bias voltage was applied to the substrate to tune the frequencies electrostatically. Because the DC bias influences the mid-plane stretching of the microbeam structure, its mode frequencies were tuned as shown in FIG. 4. In a common electrostatically actuated resonator system, mode frequencies decrease with the DC bias voltage because of the softening effect of electrostatic force. In this system, on the contrary, the mode frequencies increase with the DC bias voltage. The thickness of the resonator was just 500 nm, but the gap between resonator and substrate was 2 µm. This large gap-to-thickness ratio resulted in the mode frequencies increasing with DC bias voltage and improved the tunability of the system.

Figure 5:
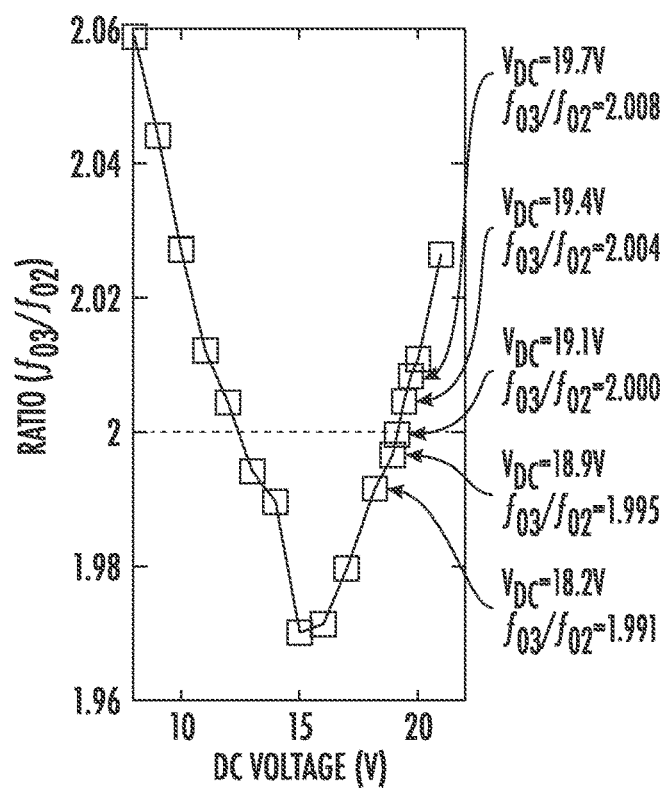
FIG. 5 shows the ratio of third to second flexural mode frequencies under different DC bias voltages.

FIG. 5 shows the ratio of third to second flexural mode frequencies under different DC bias voltages, when finely adjusted around the 1:2 commensurate condition and eventually achieved exact 1:2 ratio when the DC bias was 19.1V. When DC bias voltage was around 19.1V, the ratio is close to commensurate. Commensurability can be finely tuned by tuning the DC bias voltage.

The prerequisite of IR is the commensurability and provided herein is a DC tuning strategy to satisfy commensurability within reasonable fabrication variance. Other tuning methods can be also applied in wide range of oscillators. For example, in a Duffing oscillator, resonant frequency increases with driving amplitude (amplitude-frequency effect) because of hardening effect of nonlinearity. So, when two modes are nearly commensurate, use this amplitude-frequency effect to increase or decrease driving force to satisfy commensurability. Another tuning method is electrothermally tuning. By applying a DC voltage between two anchors of the clamped-clamped beam, a current passes through the beam and heats it. The stiffness of the beam is increased due to the Joules heating effect and thus, the modal frequencies of the beam change. Combining these tuning methods with advanced fabrication techniques, IR could be widely applied to micromechanical and nanomechanical oscillators.

Thus, designed and fabricated herein is a micromechanical resonator with thin-layer, stepped-beam structure.

Through DC bias tuning strategy, a 1:2 commensurate relation is achieved between second and third flexural modes. Through this strong nonlinear coupling, unique M-shape resonant amplitude curves happens instead of simply hardening or softening curves and a broad IR range is achieved. The frequency stability is improved by this IR mechanism and after stabilization, the measured Allan Deviation is close to its thermal-mechanical noise limit.

Figure 6:
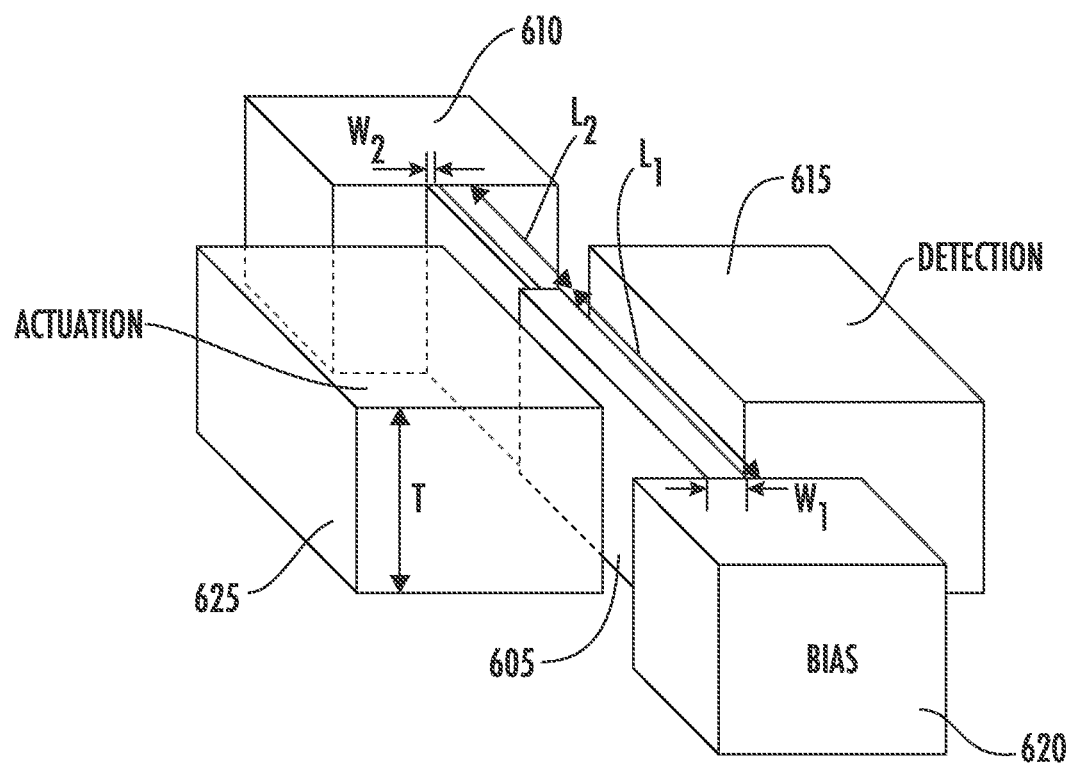
FIG. 6 is an illustration of another example micromechanical resonator and electrodes.
Figure 7:
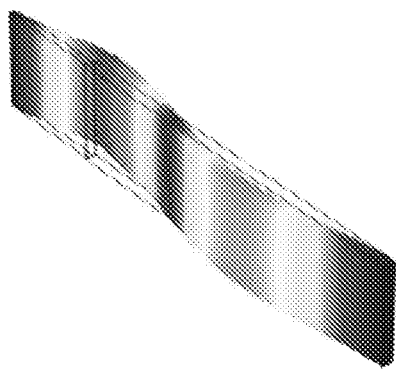
FIGS. 7 and 8 show the finite element analysis (FEA) predicted mode shape of second mode with mode frequency of 1835 kHz, and predicted mode shape of third mode with mode frequency of 3671 kHz, respectively.
Figure 8:
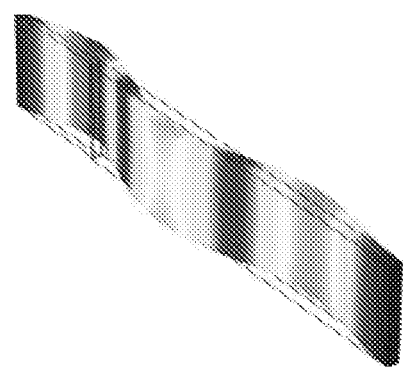

Another implementation is described with respect to FIGS. 6-8. FIG. 6 is an illustration of an example micromechanical resonator 605 and electrodes 610, 615, 620, 625. The resonator 605 and electrodes 610, 615, 620, 625 are sealed within its own vacuum chamber protecting the resonator from environmental disturbances. The resonant beam of the resonator 605 vibrates in the flexural mode in the lateral direction. The stepped-beam with the dimensions of a wider part of $L_1$=172 μm, $W_1$=5 μm and a narrower part of $L_2$=50 μm, $W_2$=3 μm with a uniform thickness of 40 μm gives the second of third mode frequencies of 1835 kHz and 3671 kHz, respectively, with their mode shapes shown in FIGS. 7 and 8.

FIGS. 7 and 8 show the finite element analysis (FEA) predicted mode shape of second mode with mode frequency of 1835 kHz, and predicted mode shape of third mode with mode frequency of 3671 kHz, respectively.

To internally couple the second and third vibrational modes, the dimensions of a stepped-beam resonator were first determined to enforce a 1:2 ratio between these mode frequencies. A linear modal analysis was conducted by a commercial finite element analysis (FEA) software COMSOL on a doubly clamped stepped-beam for various sets of width and length of the beam.

Figure 9:
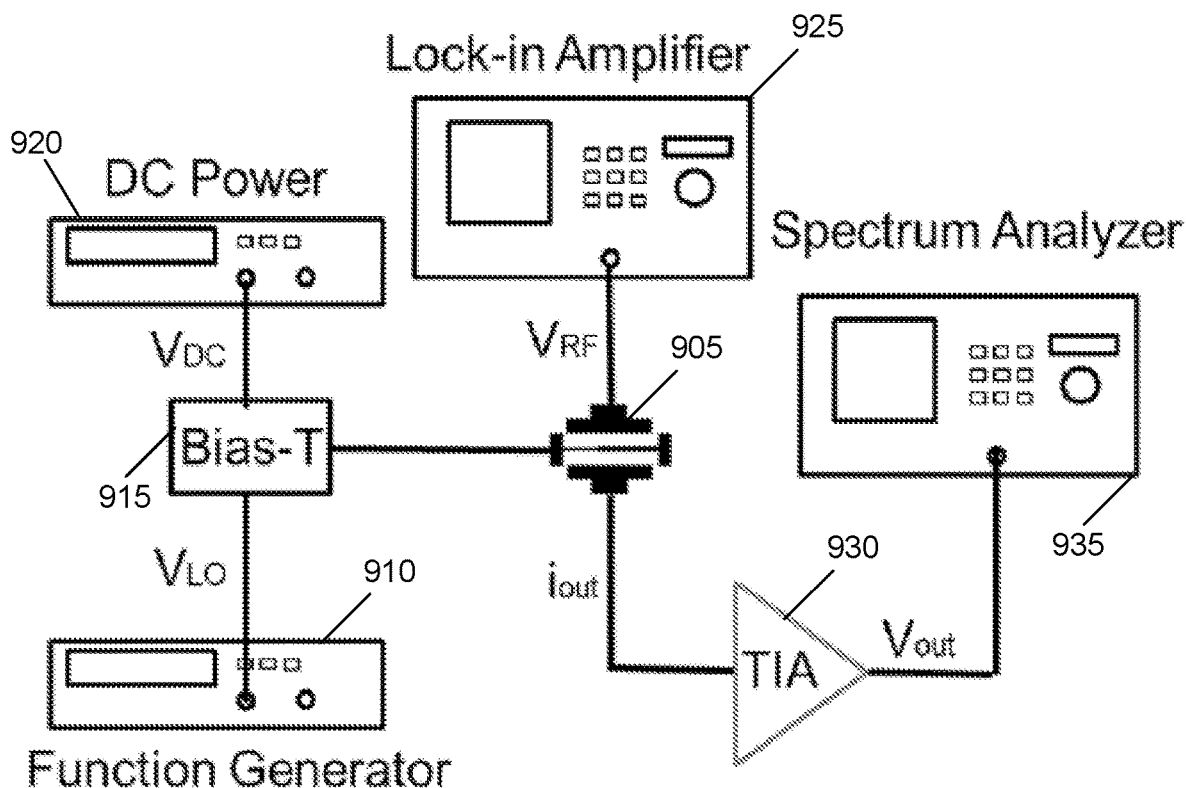
FIG. 9 is a schematic diagram of an implementation of an RF/LO mixing measurement setup.

FIG. 9 is a schematic diagram of an implementation of an RF/LO mixing measurement setup 900 for use with a resonator 905 in accordance with those described herein. A DC bias voltage from a DC power source 920 is applied to a bias electrode of the resonator 905, via a bias-T 915, while an AC voltage is applied to an actuation electrode of the resonator 905 via a lock-in amplifier 925, resulting in an electrostatic force to actuate the beam of the resonator 905 in the lateral direction. The dynamic motion of beam, in turn, introduces a time-varying capacitance between the beam and detection electrode. Finally, the AC current including the motional signal is sensed from the output electrode by a transimpedance amplifier (TIA) 930 to convert and amplify the current signal to a voltage signal.

In such a capacitive transduction, it is essential to eliminate the parasitic feedthrough capacitance that can mask the motional current. As such, use a mixing measurement system, so called RF/LO mixing measurement setup 900, as shown in FIG. 9. The lock-in amplifier 925 provides a sweeping RF signal to the actuation electrode of resonator 905, while a local oscillator (LO) signal provided by a function generator 910 is connected to the bias electrode of the resonator 905 via bias-T 915. The mixing of RF and LO signals results in a sinusoidal force with a frequency that equals to the frequency difference of RF and LO signals. When the frequency difference of RF and LO signals is set to be around the mode frequency (i.e., $\omega_{RF}-\omega_{LO}\approx\omega_0$), this sinusoidal force can be used to actuate the beam of the resonator 905. Through the TIA 930, the output current is converted to an amplified voltage signal and can be measured by either the spectrum analyzer 935 or the lock-in amplifier 925. The principle of this RF/LO mixing measurement is to circumvent parasitic feedthrough signal, because the parasitic signals exist on RF and LO frequencies rather than the frequency of driving force.

Here, the DC bias voltage can influence the mid-plane stretching of the beam of the resonator and, thus, change its modal frequencies. By tuning the DC bias, the IR range can be reached that satisfies the required 1:2 frequency commensurate condition between second and third flexural mode frequencies. This DC-tuning strategy may be used to overcome fabrication variances in devices.

The intermodal coupling of IR mechanism has a direct impact on frequency stability. When two modes are coupled and resonating with their phases locked together, the inertia of the mechanical domain, the tendency to remain at rest, increases and thus its fluctuation is reduced at the same energy level of noise.

In an implementation, a resonator comprises a silicon microcantilever which is spanned to a firm substrate by a small polymer component. In an implementation, the dimensions of the structural components are chosen to produce the desired 1:2 ratio between the second and third modal frequencies: the length (L), width (b), and thickness (h) of the silicon microcantilever (subscript 1) and polymer coupling (subscript 2) are $L_1$=500 μm, $b_1$=100 μm, $h_1$=2 μm and $L_2$=40 μm, $b_2$=12 μm, $h_2$=3 μm. These, and other dimensions provided herein, are not intended to be limiting and it is contemplated that any appropriate dimensions may be used depending on the implementation.

The thermomechanical response measured by a LDV shows that the first three linearized mode frequencies are $f_1 \cong 42$ kHz, $f_2 \cong 107$ kHz and $f_3 \cong 214$ kHz, and the second and third modal frequency values satisfy the 1:2 relation of commensurability between the second and third modes of the system. The strong geometric nonlinearity in the heterogeneous non-prismatic design combined with the 1:2 ratio between the modal frequencies triggers the IR in the dynamic response. This implies that the second and third modal responses can be internally coupled if the system is driven hard enough into the nonlinear regime. Thus, the responses in the second and third modes are monitored when one of these modes was externally driven by applying a single-frequency excitation around the mode frequency.

Figure 10:
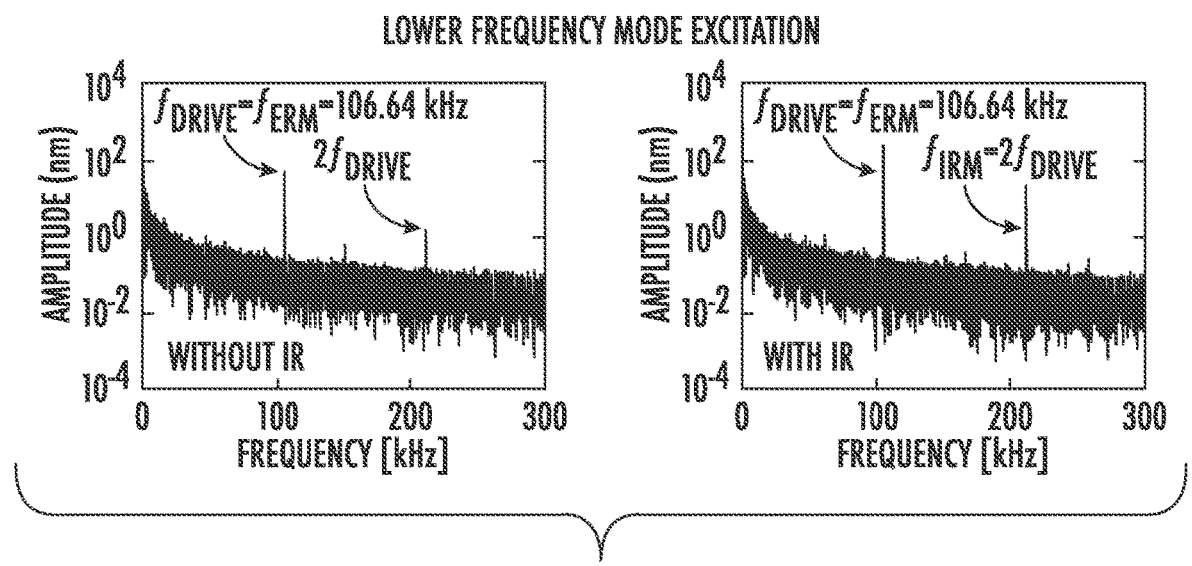
FIGS. 10 and 11 show illustrations of the comparison of the harmonic content in FFT-based spectral responses.
Figure 11:
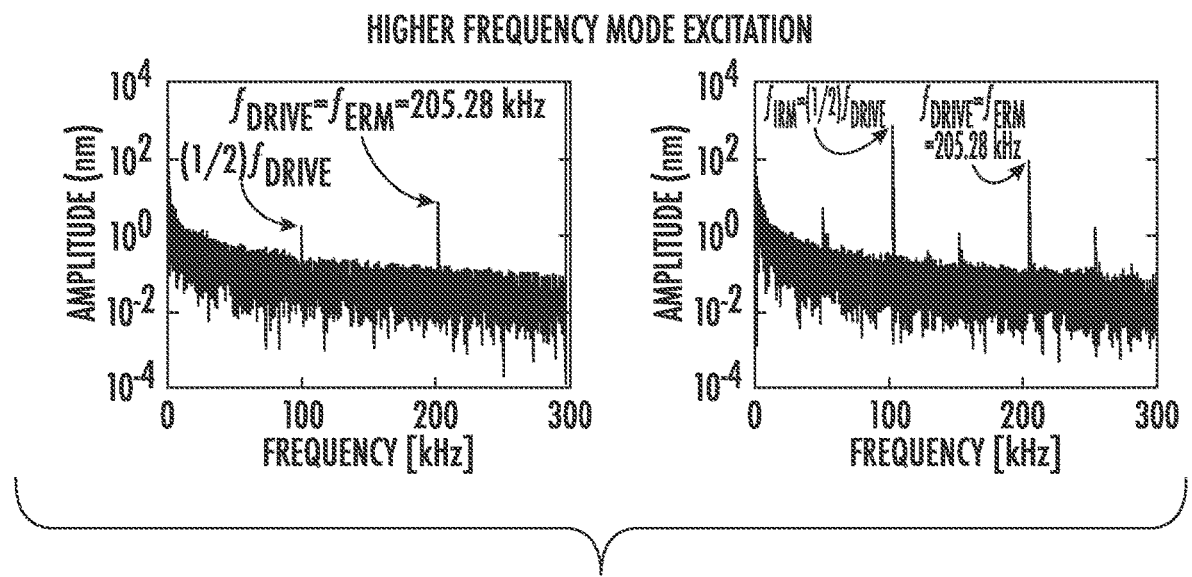

FIGS. 10 and 11 are illustrations of the comparison of the harmonic content in fast Fourier transform-based (FFT-based) spectral responses between the cases without (left column) and with (right column) IR shows that IR acts as a mechanism that amplifies the undriven IRM by tunneling the energy from the ERM. The abbreviations LM and HM are used to denote the lower-frequency (i.e., second) mode and higher-frequency (i.e., third) mode, and ERM and IRM are used to denote the externally resonated (i.e., directly driven) mode and internally resonated mode. LME (LM excitation) and HME (HM excitation) denote which mode is externally excited.

Figure 13:
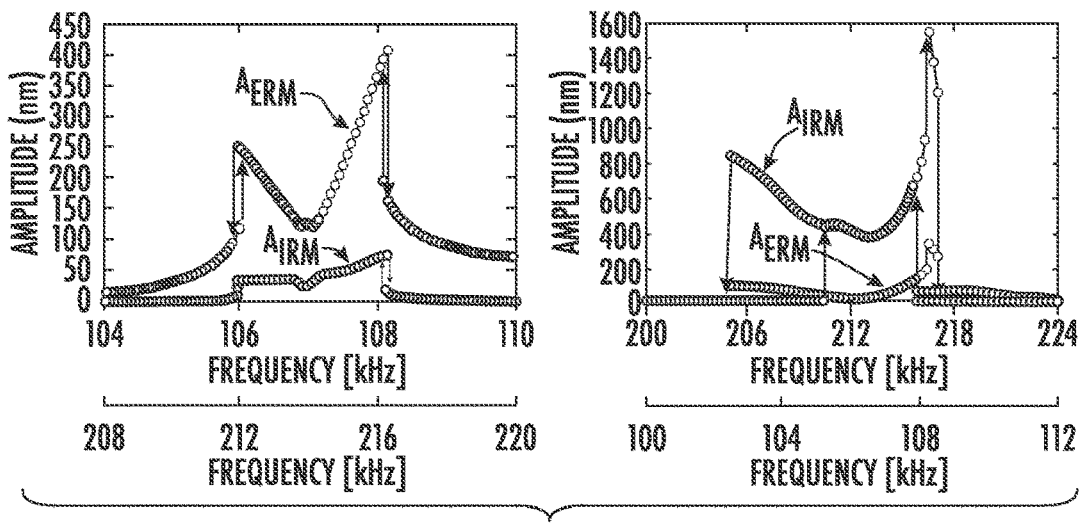

For LME with $f_{drive}$=106.04 kHz as shown in FIG. 10, the amplitude of IRM is increased from 1.34 nm to 36.35 nm as the IR is triggered, while the amplitude of ERM is increase from 30.17 nm to 242.5 nm. For HME with $f_{drive}$=258.28 kHz as shown in FIG. 13, the amplitude of IRM is increased from 1.35 nm to 825.8 nm, while the amplitude of ERM is increase from 7.1 nm to 99.78 nm. Note that the undriven IRM is a higher oscillation amplitude than the directly driven ERM for HME.

While the existence of the sub-harmonics and/or super-harmonics in a nonlinear dynamic response is not an uncommon phenomenon, the IR substantially enhances the amplitudes of those harmonics due to a strong intermodal energy transfer between the engaged modes. From the FFT responses shown in FIGS. 10 and 11, the amplitudes of these harmonics are compared between the cases in which the IR is triggered (right column) and is not triggered (left column). As the IR is activated only if the input energy is higher than a critical value (see FIG. 14), the drive voltage amplitude was tuned to either enter or escape the range of IR.

Figure 12:
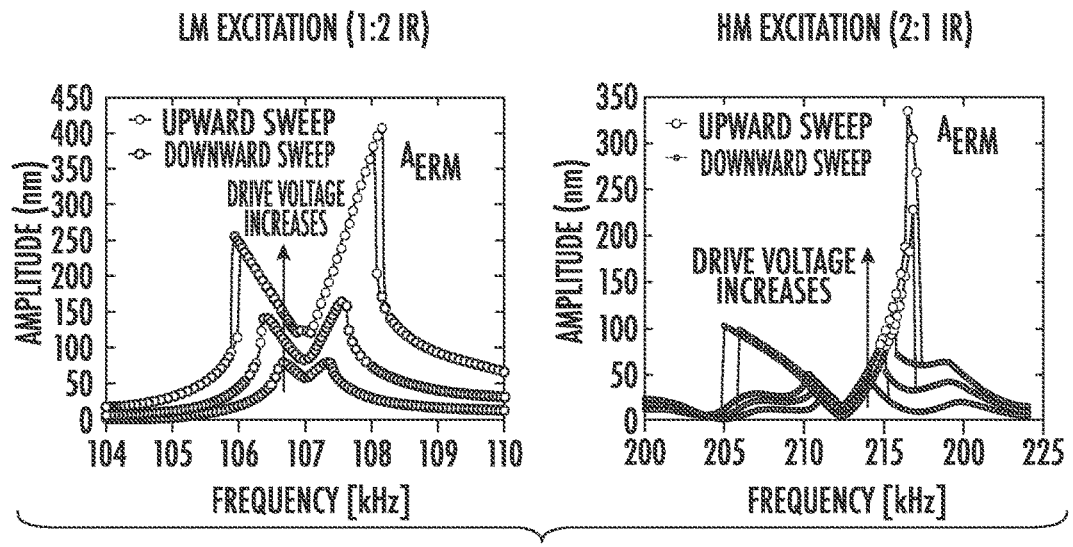
FIGS. 12, 13, and 14 show the experimental characterization of the nonlinear IR frequency responses.
Figure 14:
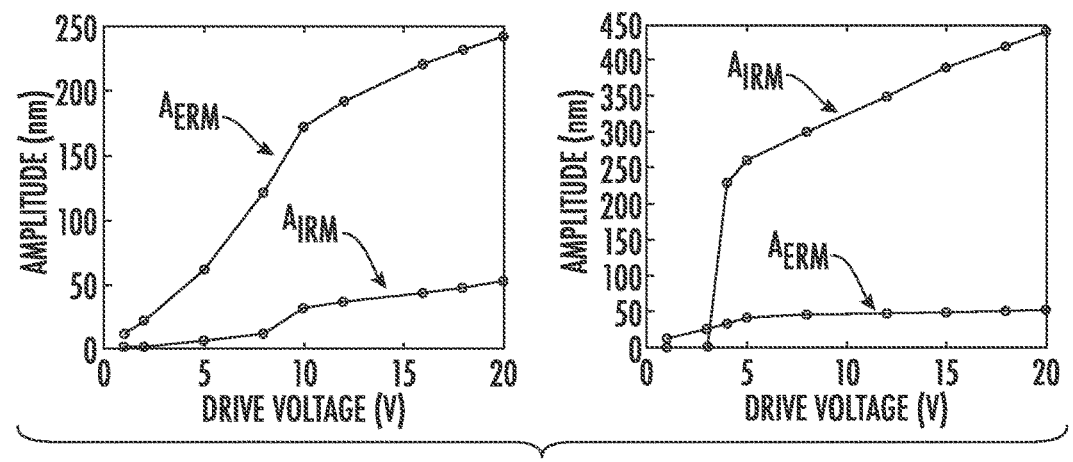

FIGS. 12-14 show the experimental characterization of the nonlinear IR frequency responses when the LM (left column) and HM (right column) are externally driven. In FIG. 12, the frequency responses of the ERM are depicted during the upward (in circle) and downward (in asterisk) frequency sweeps at three different levels of the excitation. Experimental characterization of 1:2 and 2:1 IR when the LM (in left column) and HM (in right column) are driven. FIG. 12 shows amplitudes of ERM as a function of the driving frequency show the signature M-shape IR curves at three different excitation amplitudes. The amplitudes during the upward and downward frequency sweep are shown in circle and asterisk, respectively. As the excitation amplitude increases, the IR activation range expands and hysteresis manifests. FIG. 13 shows amplitudes of the ERM (at $f_{drive}$) and IRM ($f_{IRM}=2f_{drive}$) or ($f_{IRM}=\frac{1}{2} f_{drive}$) shows coexistence of the two modes in the system when IR is activated. The IR activation range is different depending on the sweeping direction, which results in the hysteresis and jump-phenomena, marked by black arrows. FIG. 14 shows steady state amplitudes of the ERM and IRM as a function of the driving voltages show that there is a threshold energy for the onset of IR. It is clearly shown that the external energy pumped to the ERM is transferred to the IRM once the IRM is activated. The energy transfer from ERM to IRM leads to the amplitude saturation phenomenon in 2:1 IR.

The results demonstrate the typical M-shaped 1:2 IR response curves. The higher energy input to the system drives the system further into the nonlinear regime and expands the IR activation range. Eventually, hysteresis phenomena manifests because multiple stable branches co-exist. FIG. 13 shows the amplitude the ERM and IRM with respect to the driving frequency at the highest excitation voltage. As the driving frequency approaches the mode frequency from a low frequency, the ERM amplitude gradually increases. When the energy level of ERM surpasses a critical value, the IR mechanism is activated in the system and the amplitudes of both ERM and IRM are amplified. This intermodal nonlinear interaction results in the vigorous energy exchange between the engaged modes until the drop-jump phenomenon happens. These IR activation ranges are different depending on the sweeping direction, which results in hysteresis in both 1:2 and 2:1 IR responses. The hysteresis range is wider in 2:1 IR and one extra transition to an upper branch exists right before the drop-down transition.

FIG. 14 shows the ERM and IRM amplitudes with respect to the excitation level at a fixed driving frequency ($f_{drive}$=107.5 kHz in the LME and $f_{drive}$=214.2 kHz in the HME). When the LM is driven at low voltages less than 10V, the ERM amplitude increases linearly with the forcing level and the IRM amplitude is nearly zero. Due to the intrinsic geometric nonlinearity of the system, there exists a higher (second) harmonic even when the IR is not triggered. Once IR is activated at around 10V of the driving voltage, a sudden jump in the IRM amplitude occurs while energy continuously transfers from the directly driven ERM to the un-driven IRM. When the HM is externally driven, the so-called amplitude saturation phenomenon occurs beyond a threshold forcing level around 5V, where the extra energy applied to the ERM is channeled directly into the un-driven IRM, and ERM amplitude keeps constant. Comparing 1:2 IR and 2:1 IR, one can conclude that the intermodal energy transfer from IRM to ERM is more vigorous and effective in the case of the HME as the amplitude of the IRM exceeds that of the ERM by an order.

An analytical model is provided based on the energy method to further understand the underlying dynamics in the nonlinear 1:2 and 2:1 IR systems. The analytical results provide more detailed knowledge of the complex IR dynamics and the modal energy transfer. The patterns of the nonlinear resonances in IR systems drastically change depending on the type of nonlinear couplings (i.e., quadratic or cubic), coupling strength, internal detuning parameter, and forcing level. Thus, studying the effective parameters responsible for the unique resonance behaviors is essential to explore IR in practical systems with the desired resonance features.

To get the analytical model, first define the transverse displacement of a beam of a resonator in which both the LM and HM are excited by a base excitation. When the base excitation frequency ($\Omega$) is close to the LM frequency (i.e., $\Omega=\omega_1+\eta\sigma_2$ where $\eta$ is a small-scale parameter and $\sigma_2$ is an external frequency detuning parameter), the LM is harmonically driven at the excitation frequency of $\Omega$ and the HM is internally resonated at the frequency of $2\Omega$. Similarly, for the case of HME, the HM is externally excited at $\Omega$ while the LM is internally resonated at $\frac{1}{2}\Omega$. Also, impose the internal frequency mismatch from the exact 1:2 ratio between the LM and HM frequencies to account for the potential deviation from the intended design in the wake of the fabrication errors and parameter randomness. In this regard, the relationship between the modal frequencies is expressed with the equation $\omega_2=2\omega_1+\eta\sigma_1$ where $\sigma_1$ is an internal frequency detuning parameter. Using the transverse displacement of a beam based upon these settings, the averaged Lagrangian and Lagrange's equation are obtained to eventually deduce a set of leading order nonlinear equations governing the modal amplitudes. The clamped-clamped structure inherently provides a nonlinear coupling between mode via mid-plane stretching.

The leading-order governing equations show that each LM or HM itself is modeled as a linear harmonic oscillator with quadratic nonlinear coupling originating from the axial strain ($\epsilon_{xx}$). The axial stretching brings about the cubic coupling terms between the modal amplitudes of $A_1$ and $A_2$ (e.g., $A_1^3, A_2^3, A_1^2A_2, A_1A_2^2$) in the strain energy, but only the term of $A_1^2A_2$ remains as the only effective nonlinear term in the time-averaged Lagrangian equation. Solving these equations under the steady-state condition, the resulting dynamic behaviors are analytically characterized under various sets of system parameters to suggest the strategies to tailor the complex IR dynamics.

Figure 15:
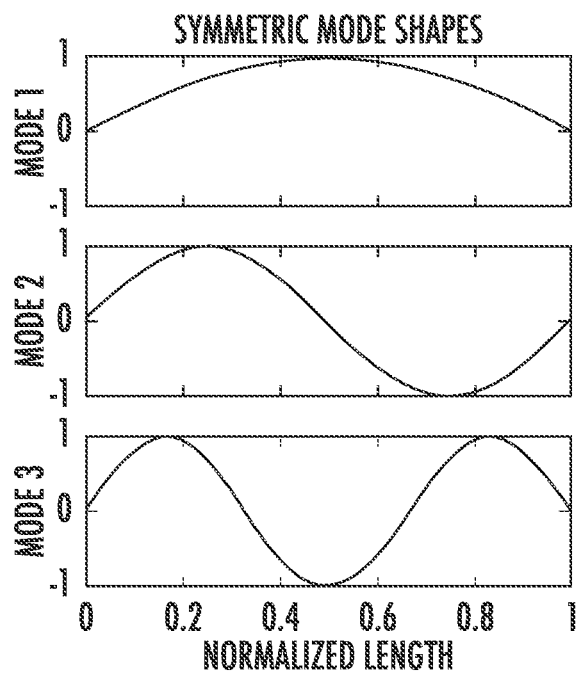
FIGS. 15 and 16 respectively show that first three flexural mode shapes with a symmetrical configuration and asymmetrical configuration.
Figure 16:
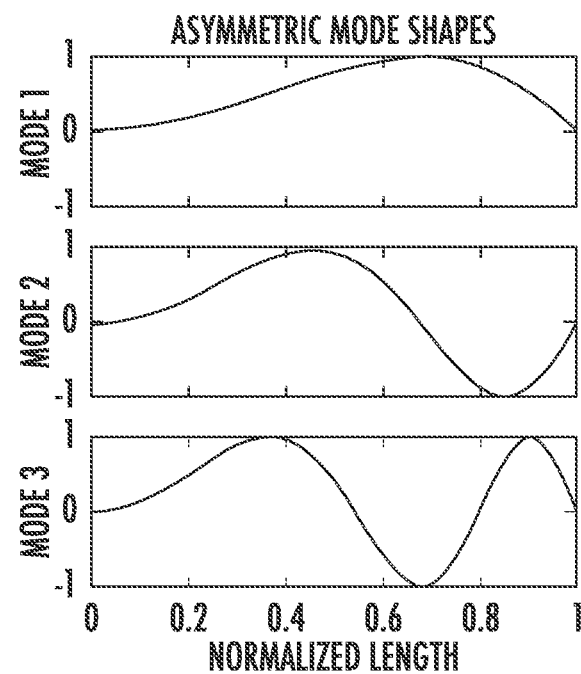

The nonlinear coupling terms are generated by the pure geometric (stretching) effect and, thus, determined by the geometric parameters and linear mode shapes of the engaged LM and HM. Therefore, one can design the 1:2 IR systems with the targeted resonance behaviors by tailoring the geometric parameters. To suggest the design parameters that can effectively integrate IR in micromechanical resonators and nanomechanical resonators, the effect of mode shapes is investigated by considering two sets of symmetric and asymmetric mode shapes. These symmetric and asymmetric mode shapes are expressed by families of trial functions $$w_n(x) = \sin\left(\frac{n\pi}{L}x\right) \text{ and } w_n(x) = \sin\left(\frac{n\pi}{L}x^2\right)$$

for n=1, 2, 3 as depicted in FIGS. 15 and 16, respectively. FIGS. 15 and 16 respectively show that first three flexural mode shapes with a symmetrical configuration $$w_n(x) = \sin\left(\frac{n\pi}{L}x\right)$$

and asymmetrical configuration with $$w_n(x) = \sin\left(\frac{n\pi}{L}x^2\right)$$

for n=1, 2, 3.

The coupling coefficients are shown in Table I where other system parameters are set to be same. Nonlinear coefficients in 1:2 IR systems with symmetrical and asymmetrical flexural modes. Geometric parameters other than the mode shapes are set to be constant as ρ=1, $$\left(\frac{\upsilon\mu}{1-2\upsilon}+\mu\right)=1,$$

L=1, h=0.01.

TABLE I

| | Beam with symmetrical mode shapes Flexural mode numbers | | | Beam with asymmetrical mode shapes Flexural mode numbers | | |
|---|---|---|---|---|---|---|
| | $1^{st}$-$2^{nd}$ | $1^{st}$-$3^{rd}$ | $2^{nd}$-$3^{rd}$ | $1^{st}$-$2^{nd}$ | $1^{st}$-$3^{rd}$ | $2^{nd}$-$3^{rd}$ |
| $|\alpha_1|$ | 0 | 2.23 | 3.19 | 5.65 | 10.95 | 18.84 |
| $|\alpha_2|$ | 0 | 0.56 | 0.80 | 1.29 | 2.42 | 4.54 |

The results summarized in Table I suggest two noticeable facts. Firstly, the asymmetric mode shapes provide stronger intermodal coupling between any of the three modes compared to the symmetric mode shapes. Note that in a prismatic beam with identical boundary conditions at both ends, it is not only difficult to achieve the integer n:m ratio between the modal frequencies but also the coupling is weaker than the structures with asymmetric modes. Secondly, the strongest coupling occurs between the second and third modes amongst the lowest three flexural modes that are relatively readily achievable in practice. These two attributes confirm the validity of the mechanical resonator design in this study where 1:2 ratio is implemented between the second and third modes in a heterogeneous non-prismatic beam.

Thus, according to some implementations, a geometrically nonlinear non-prismatic IR system comprises a silicon microcantilever and polymer coupling that incorporates a 1:2 ratio between its second and third modal frequencies. The commensurate relationship between the modes combined with the midplane stretching in the nonlinear system realizes the IR dynamics with strong modal coupling. An analytical model is used for the quadratic IR systems based on the energy method for both scenarios when the lower and higher modes are externally driven. Using this model, the characteristic behaviors of IR responses may be studied while the effective parameters are varied over a range. The mechanism of modal energy transfer may be investigated at different values of internal detuning and nonlinear coefficients. The analytical model is able to provide a valuable insight about the IR mechanism and suggest design strategies to implement IR in a clamped-clamped beam structure: (i) the mid-plane stretching due to the constrained boundary conditions provides the nonlinear (quadratic) coupling mechanism between two flexural modes, which is more dominant than the cubic geometric nonlinearity due to stretching of its own mode, (ii) the higher coupling renders the wider IR dynamic range with a lower activation threshold, (iii) the mode shapes of the engaged modes determine the coupling strength, and (iv) coupling second and third flexural modes in an asymmetric structure is a practically effective method to escalate the IR.

Targeting the desired IR response strongly relies on the accurate allocation of system parameters, such that small perturbations in the parameters can drastically alter the activation of IR, nonlinear resonances and bifurcation points. IR can be integrated in a clamped-clamped beam structure by modifying the geometric parameters to satisfy the IR conditions. Even though the experimental demonstration is performed in a non-prismatic beam with two materials (silicon and polymer), a silicon beam with varying dimension (e.g., a stepped-beam, a tapered-beam) can be similarly employed. A clamped-clamped beam structure, that is most commonly used in MEMS/NEMS applications, provides a practical platform to take benefits from the dynamic characteristics originating from TR. The strategies suggested herein can be readily extended to 2-dimensional plate structures as well.

MEMS/NEMS are great platforms to practically implement the IR dynamics due to their flexibility in design and fabrication. Besides, the fabrication randomness can be fairly easily overcome by frequency tunability of micro-resonators and nano-resonators (e.g., applying tension through a gate DC voltage, changing the temperature).

Conventional microfabrication techniques may be used to produce microcantilever patterns in the device layer of a silicon-on-insulator wafer. Polyimide beams may be placed and delineated onto the pre-defined silicon beams by blanket transferring and ensuing patterning, followed by deep reactive-ion etching (DRIE) of the silicon handle substrate to reveal the entire freestanding heterogeneous microstructure.

Advantages of the embodiments described or otherwise contemplated herein include: (1) the stepped-beam structure provides ample flexibility to adjust modal frequencies into n:m ratio during the design process, and (2) the thin-layer structure provides frequency tunability by controlling the mid-plane stretching effect with the applied DC bias and thus, the frequency mismatch from n:m ratio due to the fabrication error can be easily compensated.

According to some aspects, IR can be triggered and controlled readily in the MEMS oscillator. Moreover, its frequency stability is improved more than 30 times by this IR mechanism.

Regarding industry applications, MEMS oscillators have replaced the conventional mechanical oscillators (e.g., quartz oscillator) due to its advantage of high integrability with auxiliary electrical components. Thus, the low phase noise achieved by the embodiments can improve the MEMS devices applied for PNT (positioning, navigation, and timing). Moreover, the stable frequency operation is essential to improve the sensitivity of resonator-based MEMS sensors and thus the embodiments can be broadly applied to sensing technology.

In an implementation, a device comprises: a non-prismatic resonator configured to implement internal resonance (IR) to provide flexibility to adjust modal frequencies into a n:m ratio, wherein n and m are integers; and a plurality of electrodes configured to provide voltage to the resonator.

Implementations may include some or all of the following features. The resonator is one of a micromechanical resonator or a nanomechanical resonator. The resonator is a microelectromechanical systems (MEMS) resonator. The MEMS resonator is an oscillator. A mistuning between two flexural modes of the MEMS resonator can be precisely controlled by tuning a DC bias and, through strong coupling between the two flexural modes, a broader range of frequency stabilization is achieved by internal resonance (IR). The resonator comprises at least one of a stepped-beam structure that is a thin-layer structure, or a clamped-clamped beam structure. The resonator is configured to implement the IR to adjust the modal frequencies into a n:m ratio, wherein m and n are different integers, each greater than one. The resonator is configured that when driven by a single-frequency actuation and conditions for IR are satisfied, two engaged modes are simultaneously resonated with their phases locked together through an intermodal energy transfer. Through DC bias tuning strategy, a 1:2 commensurate relation is achieved between second and third flexural modes. The resonator comprises a non-prismatic beam. The device further comprises a stepped clamped-clamped silicon microbeam. The stepped clamped-clamped silicon microbeam is fabricated by a MEMS fabrication flow to implement an IR mechanism.

In an implementation, a system comprises a microcantilever that incorporates a 1:2 ratio between second and third modal frequencies of the microcantilever.

Implementations may include some or all of the following features. The microcantilever comprises silicon. The system is a geometrically nonlinear non-prismatic internal resonance (IR) system. A commensurate relationship between modes of the cantilever combined with midplane stretching in the system realizes internal resonance (IR) with strong modal coupling. The microcantilever comprises a stepped-beam structure configured to provide flexibility to adjust modal frequencies into a n:m ratio, wherein n and m are integers. The microcantilever is configured to adjust the modal frequencies into a n:m ratio, wherein m and n are different integers, each greater than one. The microcantilever comprises a thin-layer structure configured to provide frequency tunability by controlling a mid-plane stretching effect with an applied DC bias. The thin-layer structure is configured to compensate for a frequency mismatch from a n:m ratio due to a fabrication error.

It should be understood that the various techniques described herein may be implemented in connection with hardware components or software components or, where appropriate, with a combination of both. Illustrative types of hardware components that can be used include Field-Programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc. The methods and apparatus of the presently disclosed subject matter, or certain aspects or portions thereof, may take the form of program code (i.e., instructions) embodied in tangible media, such as floppy diskettes, CD-ROMs, hard drives, or any other machine-readable storage medium where, when the program code is loaded into and executed by a machine, such as a computer, the machine becomes an apparatus for practicing the presently disclosed subject matter.

Although exemplary implementations may refer to utilizing aspects of the presently disclosed subject matter in the context of one or more stand-alone computer systems, the subject matter is not so limited, but rather may be implemented in connection with any computing environment, such as a network or distributed computing environment. Still further, aspects of the presently disclosed subject matter may be implemented in or across a plurality of processing chips or devices, and storage may similarly be effected across a plurality of devices. Such devices might include personal computers, network servers, and handheld devices, for example.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A device comprising:
   a non-prismatic resonator configured to implement internal resonance (IR) to provide flexibility to adjust modal frequencies into a n:m ratio, wherein n and m are integers; and
   a plurality of electrodes configured to provide voltage to the resonator,
   wherein the non-prismatic resonator is a clamped-clamped silicon structure with one or more steps.

2. The device of claim 1, wherein the resonator is one of a micromechanical resonator or a nanomechanical resonator.

3. The device of claim 1, wherein the resonator is a microelectromechanical systems (MEMS) resonator.

4. The device of claim 3, wherein the MEMS resonator is an oscillator.

5. The device of claim 3, wherein a mistuning between two flexural modes of the MEMS resonator can be precisely controlled by tuning a DC bias and, through strong coupling between the two flexural modes, a broader range of frequency stabilization is achieved by internal resonance (IR).

6. The device of claim 1, wherein the resonator comprises at least one of a stepped-beam structure that is a thin-layer structure, or a clamped-clamped beam structure.

7. The device of claim 1, wherein the resonator is configured to implement the IR to adjust the modal frequencies into a n:m ratio, wherein m and n are different integers, each equal or greater than one.

8. The device of claim 1, wherein the resonator is configured that when driven by a single-frequency actuation and conditions for IR are satisfied, two engaged modes are simultaneously resonated with their phases locked together through an intermodal energy transfer.

9. The device of claim 1, wherein through DC bias tuning strategy, a 1:2 commensurate relation is achieved between second and third flexural modes.

10. The device of claim 1, wherein the resonator comprises a non-prismatic beam.

11. The device of claim 1, wherein the stepped clamped-clamped silicon microbeam is fabricated by a MEMS fabrication flow to implement an IR mechanism.

12. A system comprising:
    a micro-resonator that incorporates a 1:2 ratio between second and third modal frequencies of the micro-resonator,
    wherein the micro-resonator comprises a structure with one or more steps configured to provide flexibility to adjust modal frequencies into a n:m ratio, wherein n and m are integers.

13. The system of claim 12, wherein the micro-resonator comprises silicon.

14. The system of claim 12, wherein the system is a geometrically nonlinear non-prismatic internal resonance (IR) system.

15. A system comprising:
   a micro-resonator that incorporates a 1:2 ratio between second and third modal frequencies of the microcantilever,
   wherein a commensurate relationship between modes of the cantilever combined with midplane stretching in the system realizes internal resonance (IR) with strong modal coupling.

16. The system of claim 12, wherein the micro-resonator is configured to adjust the modal frequencies into a n:m ratio, wherein m and n are different integers, each greater than one.

17. A system comprising:
   a micro-resonator that incorporates a 1:2 ratio between second and third modal frequencies of the micro-resonator,
   wherein the micro-resonator comprises a thin-layer structure configured to provide frequency tunability by controlling a mid-plane stretching effect with an applied DC bias.

18. The system of claim 17, wherein the thin-layer structure is configured to compensate for a frequency mismatch from a n:m ratio due to a fabrication error.

* * * * *